(12) United States Patent
Kim et al.

(10) Patent No.: US 10,199,444 B2
(45) Date of Patent: Feb. 5, 2019

(54) DISPLAY DEVICE

(71) Applicant: SAMSUNG DISPLAY CO., LTD., Yongin-si, Gyeonggi-do (KR)

(72) Inventors: Ki Hyun Kim, Yongin-si (KR); Jin Suk Lee, Yongin-si (KR); Young Gil Park, Yongin-si (KR); Hyun Sang Seo, Yongin-si (KR); Na Ri Ahn, Yongin-si (KR); Sung Chan Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/794,060

(22) Filed: Oct. 26, 2017

(65) Prior Publication Data
US 2018/0261657 A1 Sep. 13, 2018

(30) Foreign Application Priority Data
Mar. 10, 2017 (KR) .................... 10-2017-0030797

(51) Int. Cl.
*H01L 27/32* (2006.01)
*H01L 29/49* (2006.01)
*H01L 51/52* (2006.01)
*H01L 51/50* (2006.01)

(52) U.S. Cl.
CPC ...... *H01L 27/3248* (2013.01); *H01L 27/3218* (2013.01); *H01L 27/3246* (2013.01); *H01L 29/4908* (2013.01); *H01L 51/5056* (2013.01); *H01L 51/5072* (2013.01); *H01L 51/5092* (2013.01); *H01L 51/5215* (2013.01); *H01L 51/5234* (2013.01); *H01L 51/5237* (2013.01); *H01L 2251/308* (2013.01)

(58) Field of Classification Search
CPC ............ H01L 27/3248; H01L 27/3218; H01L 27/3246; H01L 29/4908; H01L 51/5056; H01L 51/5072; H01L 51/5092; H01L 51/5215; H01L 51/5234; H01L 51/5237; H01L 2251/308
See application file for complete search history.

(56) References Cited

U.S. PATENT DOCUMENTS 8,319,221 B2  11/2012  Choi et al.
2008/0218058 A1*  9/2008  Son ................... H01L 51/5218
                                                          313/500

* cited by examiner

*Primary Examiner* — Karen Kusumakar
(74) *Attorney, Agent, or Firm* — Cantor Colburn LLP

(57) ABSTRACT

A display device includes a substrate including a display area and a non-display area, a plurality of pixels provided in the display area, lines respectively connected to the plurality of pixels, the lines applying a signal to the plurality of pixels, the lines each including a first metal layer including a first metal and a second metal layer that is provided on the first metal layer and includes a second metal, an insulating layer provided at least one portion between the substrate and the lines, the insulating layer including an inorganic insulating layer and an organic insulating layer, and a barrier layer provided between the organic insulating layer and the first metal layer, the barrier layer including an oxide of the first metal.

26 Claims, 10 Drawing Sheets

DISPLAY DEVICE

This application claims priority to Korean Patent Application No. 10-2017-0030797, filed on Mar. 10, 2017, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

An organic light emitting display device is used to display an image using organic light emitting diodes that are self-luminescent elements, and has come into the spotlight as a next-generation display device because of its excellent luminance and color purity. In such an organic light emitting display device, a plurality of pixels is formed using color pixels such as red pixels, green pixels, and blue pixels, and accordingly, various color images are displayed.

An organic light emitting display device generally includes multi-layered insulating layers provided on a substrate, lines disposed on the multi-layered insulating layers, and the plurality of pixels connected to the lines.

SUMMARY

Exemplary embodiments provide a high-quality display device and a line structure employed in the display device.

According to an exemplary embodiment of the invention, there is provided a display device including a substrate including a display area and a non-display area, a plurality of pixels provided in the display area, lines respectively connected to the plurality of pixels, the lines applying a signal to the plurality of pixels, the lines each including a first metal layer including a first metal and a second metal layer that is provided on the first metal layer and includes a second metal, an insulating layer provided at a least one portion between the substrate and the lines, the insulating layer including an inorganic insulating layer and an organic insulating layer, and a barrier layer provided between the organic insulating layer and the first metal layer, the barrier layer including an oxide of the first metal.

In an exemplary embodiment, the organic insulating layer, the barrier layer, and the lines may include oxygen atoms, and the oxygen atoms may have a highest concentration peak in the barrier layer. The first metal and the oxygen atoms may be contained at a ratio of about 1:1 to about 3:1 in the barrier layer.

In an exemplary embodiment, the barrier layer may have a thickness of 10 angstroms (Å) to 200 Å. The first metal layer may have a thickness of 250 Å to 600 Å.

In an exemplary embodiment, the organic insulating layer may include at least one of a polyimide-based compound, a polyacryl-based compound, a fluorine-based polymer compound including Teflon, a polyorganosiloxane-based compound, a benzocyclobutene-based compound, a phenol-based compound, an epoxy-based compound, polyamide-based compound, polyphenylene ether-based compound, and a polyphenylene sulfide-based compound.

In an exemplary embodiment, the first metal may be titanium and the second metal may be aluminum. The display device may further include a third metal layer provided on the second metal, the third metal layer including a third metal. The third metal may be titanium.

In an exemplary embodiment, the insulating layer may be provided in plurality, at least one of the plurality of insulating layers may be provided as the organic insulating layer, the lines may be provided on at least one of the plurality of insulating layers, and the barrier layer may be provided between the organic insulating layer and the line.

In an exemplary embodiment, the lines may include a first line provided on one of the plurality of insulating layers and a second line provided on one of the others of the plurality of insulating layers, and the first line and the second line may be connected to each other through a contact hole defined in an insulating layer provided between the first line and the second line.

In an exemplary embodiment, the contact hole may be defined as a sidewall provided by removing the insulating layer provided between the first line and the second line, and the barrier layer may be provided on the sidewall when the insulating layer provided between the first line and the second line is the organic insulating layer.

In an exemplary embodiment, the first line and the second line may be in direct contact with each other in the contact hole, and the barrier layer may not be provided between the first line and the second line.

In an exemplary embodiment, the plurality of insulating layers may include first to fourth insulating layers sequentially provided on the substrate.

In an exemplary embodiment, the non-display area may include a bent area in which the substrate is bent. An opening through which a portion of the substrate is exposed may be defined in the first to third insulating layers may in the bent area, and the insulating layer may include a bent part insulating layer provided as the organic insulating layer in the opening.

In an exemplary embodiment, each of the plurality of pixels may include a thin film transistor ("TFT") provided on the substrate, and a display element connected to the TFT. The TFT may include an active pattern provided on the substrate, a gate electrode provided on the first insulating layer, and source and drain electrodes provided on the third insulating layer.

In an exemplary embodiment, the lines may include data lines connected to the source electrodes. The data lines may be provided on the third insulating layer, the third insulating layer may be provided as the organic insulating layer, and the barrier layer may be provided between the data lines and the third insulating layer.

In an exemplary embodiment, the lines may further include connection lines that are connected to the data lines and are provided on the fourth insulating layer, the fourth insulating layer may be provided as the organic insulating layer, and the barrier layer may be provided between the connection lines and the fourth insulating layer.

In an exemplary embodiment, the non-display area may include a bent area in which the substrate is bent. The insulating layer may include a bent part insulating layer provided as the organic insulating layer in the bent area. The lines may be provided on the bent part insulating layer in the bent area, and the barrier layer may be provided between the lines and the bent part insulating layer.

In an exemplary embodiment, the non-display area may include a bent area in which the substrate is bent. The insulating layer may include a bent part insulating layer provided in the bent area and a fourth insulating layer provided on the bent part insulating layer. The bent part insulating layer and the fourth insulating layer may be provided as the organic insulating layers, the lines may be provided on at least one of the bent part insulating layer and the fourth insulating layer, and the barrier layer may be provided between the lines and at least one of the bent part insulating layer and the fourth insulating layer.

In an exemplary embodiment, the organic insulating layer and the barrier layer may be in contact with each other, and the barrier layer and the first metal layer may be in contact with each other.

According to an exemplary embodiment of the invention, there is provided a line structure including a substrate, a line provided on the substrate, an organic insulating layer provided in at least one region between the substrate and the line, and a barrier layer provided between the organic insulating layer and the line, wherein the line includes a first metal layer including a first metal and a second metal layer that is provided on the first metal layer and includes a second metal, and the barrier layer includes an oxide of the first metal.

According to an exemplary embodiment of the invention, there is provided a method for forming a line, the method including forming an organic insulating layer in at least one region on a substrate, forming a barrier layer on the substrate on which the organic insulating layer is provided, and forming a line on the barrier layer, wherein the forming the line includes forming a first metal layer on the barrier layer, forming a second metal layer on the first metal layer, and patterning the first and second metal layers, wherein the barrier layer and the first metal layer are provided through a single process.

The barrier layer and the first metal layer may be provided through chemical vapor deposition, physical vapor deposition, atomic layer deposition, or spacer patterning.

BRIEF DESCRIPTION OF THE DRAWINGS

Exemplary embodiments, advantages and features of the invention will now be described more fully hereinafter with reference to the accompanying drawings, in which.

DETAILED DESCRIPTION

Figure 1:
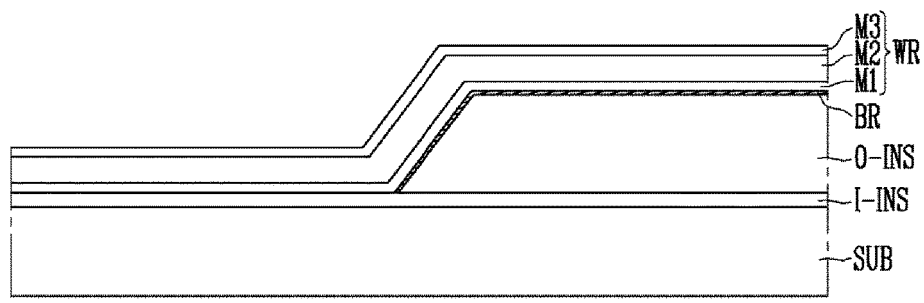
FIG. 1 is a sectional view illustrating a line structure according to an exemplary embodiment of the invention.

The disclosure may apply various changes and different shape, therefore only illustrate in details with particular examples. However, the examples do not limit to certain shapes but apply to all the change and equivalent material and replacement. The drawings included are illustrated a fashion where the drawing figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

The invention relates a line structure, and more particularly, to a line structure used in a display device. FIG. 1 is a sectional view illustrating a line structure according to an exemplary embodiment of the invention.

Referring to FIG. 1, the line structure according to the exemplary embodiment of the invention includes a substrate SUB, an insulating layer provided on the substrate SUB, a barrier layer BR provided on the insulating layer, and a line WR provided on the barrier layer BR.

The substrate SUB is not particularly limited as long as it enables the line WR to be disposed (e.g., mounted) thereon. The substrate SUB may include an insulative material such as glass or resin. Also, the substrate SUB may include a material having flexibility to be bendable or foldable. The substrate SUB may have a single- or multi-layered structure.

In an exemplary embodiment, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and polyurethane. However, the material constituting the substrate SUB may be variously changed, and the substrate SUB may include fiber glass reinforced plastic ("FRP"), or the like, for example.

At least one portion of the insulating layer is provided as an organic insulating layer. In an exemplary embodiment of the invention, a portion of the insulating layer may be provided as an organic insulating layer, and the other portion of the insulating layer may be provided as an inorganic insulating layer. When the insulating layer includes both of the organic insulating layer and the inorganic insulating layer, the insulating layer may be provided in a multi-layer in the form in which any one layer is disposed on another layer. In an alternative exemplary embodiment, the organic insulating layer and the inorganic insulating layer may be provided in regions different from each other in a plan view. In this case, the insulating layer may be provided in a single layer or a multi-layer. As an example, FIG. 1 illustrates a case where the insulating layer includes an inorganic insulating layer I-INS and an organic insulating layer O-INS, the inorganic insulating layer I-INS is disposed on the substrate SUB, and the organic insulating layer O-INS is disposed in a partial region on the inorganic insulating layer I-INS.

In an exemplary embodiment, the organic insulating layer O-INS may include at least one of organic insulating materials such as a polyimide-based compound, a polyacryl-based compound, a fluorine-based polymer compound including Teflon, a polyorganosiloxane-based compound, a benzocyclobutene-based compound, a phenol-based compound, an epoxy-based compound, polyamide-based compound, polyphenylene ether-based compound, or a polyphenylene sulfide-based compound. In an exemplary embodiment, the inorganic insulating layer I-INS may include an inorganic insulating material such as polysiloxane, silicon nitride, silicon oxide, or silicon oxynitrde.

The organic insulating layer O-INS has flexibility relatively higher than that of the inorganic insulating layer I-INS. Hence, a structure in which the organic insulating layer O-INS is provided has flexibility higher than that of a structure in which only the inorganic insulating layer I-INS is provided. Accordingly, the line WR provided on the organic insulating layer O-INS may be applied to various flexible devices.

The line WR is provided on the insulating layer. The line WR includes a metal that is a conductive material, and is provided in a multi-layer. The line WR may be used in various electronic devices to transmit electronic signals. In an exemplary embodiment, the line WR may be a line used in a display device, for example. In this case, the line WR may include a data line, a scan line, a power line, and other various signal lines.

In the exemplary embodiment of the invention, it is illustrated that the line WR is provided as, for example, a triple layer including a first metal layer M1, a second metal layer M2, and a third metal layer M3, which are sequentially stacked, but the invention is not limited thereto. In another exemplary embodiment of the invention, the line WR may be provided as a double layer including the first metal layer M1 and the second metal layer M2, which are sequentially stacked. In still another exemplary embodiment, the line WR may be provided as a quadruple or higher layer.

The first metal layer M1 may include a first metal, the second metal layer M2 may include a second metal, and the third metal layer M3 may include a third metal. In an exemplary embodiment, each of the first to third metals may independently include at least one of metals such as gold (Au), silver (Ag), aluminum (Al), molybdenum (Mo), chromium (Cr), titanium (Ti), nickel (Ni), neodymium (Nd), copper (Cu), platinum (Pt), palladium (Pd), tin (Sn), cobalt (Co), rhodium (Rh), iridium (Ir), ruthenium (Ru), osmium (Os), manganese (Mn), tungsten (W), tantalum (Ta), bismuth (Bi), antimony (Sb), lead (Pb), and zinc (Zn), or any alloy thereof.

The metal constituting the line WR may be variously selected depending on conditions by considering conductivity of the metal, reactivity and adhesion with the organic insulating layer O-INS or the inorganic insulating layer I-INS, easiness of a formation process, a degree of diffusion into other layers, and the like. In an exemplary embodiment, the second metal may be selected from metals having relatively high conductivity, and the first and second metals may be selected from metals that have relatively low reactivity, excellent adhesion, and a low degree of diffusion into other layers, for example.

In an exemplary embodiment of the invention, the first metal may be titanium, the second metal may be aluminum, and the third metal may be titanium, for example. However, the kinds of the first to third metals are not limited thereto, and it will be apparent that the first to third metals may be provided as other metals.

The first metal layer M1 and the second metal layer M2 may be provided to have thicknesses equal to or different from each other. The second metal layer M2 may be provided thicker than the first metal layer M1. In an exemplary embodiment, the first metal layer M1 may have a thickness of 300 angstroms (Å) to 600 Å, and the second metal layer M2 may have a thickness of 1000 Å or greater, for example. In an exemplary embodiment of the invention, the third metal layer M3 may have the same thickness as that of the first metal layer M1. However, the thickness of the third metal layer M3 is not limited thereto, and the third metal layer M3 may have another thickness in another exemplary embodiment.

The barrier layer BR is provided between the organic insulating layer O-INS and the line WR, and is in direct contact with the organic insulating layer O-INS and the line WR. That is, the organic insulating layer O-INS, the barrier layer BR, and the line WR are sequentially stacked, and another layer is not interposed between the organic insulating layer O-INS and the line WR and between the barrier layer BR and the line WR. The barrier layer BR is substantially in direct contact with the first metal layer M1 of the line WR. When the organic insulating layer O-INS is provided in only a partial region on the substrate SUB, an end portion of the organic insulating layer O-INS may be provided in the shape of a sidewall, and the barrier layer BR is also provided on the sidewall.

The barrier layer BR is not provided between the inorganic insulating layer I-INS and the line WR in a predetermined portion. Accordingly, the line WR disposed on the inorganic insulating layer I-INS is in direct contact with an upper surface of the inorganic insulating layer I-INS in the predetermined portion. Since the line WR includes the first metal layer M1 and the second metal layer M2, which are sequentially stacked, the first metal layer M1 is in direct contact with the inorganic insulating layer I-INS.

The barrier layer BR includes an oxide of the first metal included in the first metal layer M1. In an exemplary embodiment, when the first metal is titanium, the barrier layer BR includes titanium oxide (TiOx), for example.

In an exemplary embodiment of the invention, the barrier layer BR may have a thickness of 10 Å to 200 Å, for example.

Oxygen atoms are contained in the organic insulating layer O-INS, the barrier layer BR, and the line WR. The oxygen atoms has the highest concentration peak in the barrier layer BR among the organic insulating layer O-INS, the barrier layer BR, and the line WR (particularly, the first metal layer). In an exemplary embodiment of the invention, the first metal and the oxygen atoms may be contained at a ratio of about 1:1 to about 3:1 in the barrier layer, for example. In other words, in the metal oxide, the oxygen atoms may be contained in a content of about 25 at % to about 50 at %, and atoms of the first metal may be contained in a content of about 50 at % to 75 at %, for example.

Figure 2:
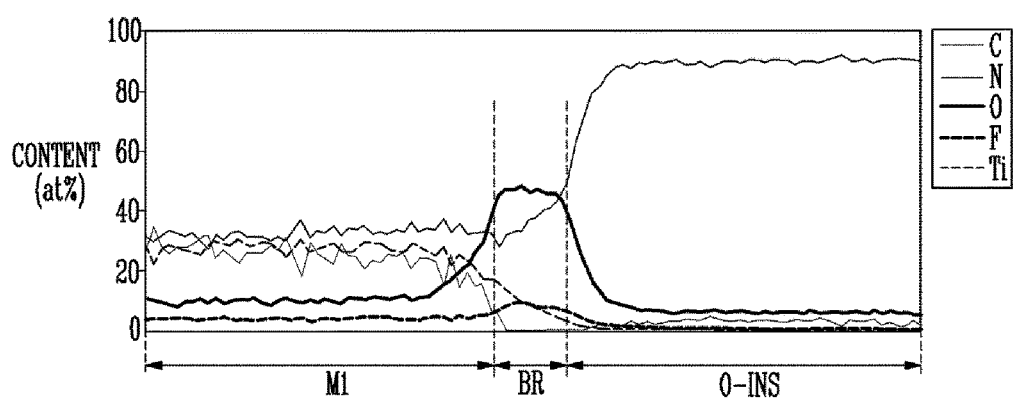
FIG. 2 illustrates transmission electron microscopy-energy dispersive spectroscopy ("TEM-EDS") in a lower portion of a first metal layer, a barrier layer, and an upper region of an organic insulating layer.

FIG. 2 illustrates transmission electron microscopy-energy dispersive spectroscopy ("TEM-EDS") in a lower portion of the first metal layer M1, the barrier layer BR, and an upper region of the organic insulating layer O-INS. In FIG. 2, titanium is used as the first metal, and polyimide and polysiloxane are used as organic materials of the organic insulating layer.

Referring to FIG. 2, titanium as the first metal is provided in a relatively high concentration in the first metal layer M1, and is not substantially provided in the organic insulating layer O-INS. A titanium concentration in the barrier layer BR is lower than that in the first metal layer M1 and higher than that in the organic insulating layer O-INS. A carbon concentration is relatively low in the first metal layer M1 and the barrier layer BR, and is relatively high, e.g., about 90 at %, in the organic insulating layer O-INS. An oxygen concentration is substantially low, e.g., about 10 at %, in the first metal layer M1 and the organic insulating layer O-INS, but substantially high, e.g., equal to or greater than about 40 at %, in the barrier layer BR. In FIG. 2, it may be seen that titanium oxide is provided in the barrier layer BR through concentrations of the titanium and the oxygen.

The barrier layer BR has elements such as fluorine and nitrogen in addition to the titanium, the oxygen and the carbon. In the illustrated exemplary embodiment, the barrier layer BR and the first metal layer M1 may further include various other substances, in addition to titanium atoms, oxygen atoms, and carbon atoms. In an exemplary embodiment, as seen in FIG. 2, the barrier layer BR and the first metal layer M1 may further include at least one of nitrogen, fluorine, and the like, for example. In an exemplary embodiment, the barrier layer BR may further include at least one of titanium nitride (TiNx), titanium fluoride (TiFx), titanium hydroxide (Ti(OH)x), titanium carboxyfluoride (TiCxOyFz), and the like, in addition to titanium oxide (TiOx). Each substance contained in the barrier layer BR and the first metal layer M1 is derived from a substance contained in the organic insulating layer O-INS thereunder or a substance provided in a process of forming the barrier layer BR and the first metal layer M1.

In the line structure according to the exemplary embodiment of the invention, corrosion of the line is prevented as compared with typical line structures, so that the occurrence of a defect in the line is minimized.

According to the typical line structures, when a line is provided on an organic insulating layer, a metal in the line is easily corroded due to the moisture absorption property of the organic insulating layer. However, according to the exemplary embodiment of the invention, since the barrier layer including metal oxide is provided between the organic insulating layer and the line, the reaction between a metal in the line and the organic insulating layer is prevented, so that the corrosion of the metal in the line is prevented.

In particular, the barrier layer may prevent the second metal in the second metal layer along with the first metal layer from being diffused into another layer, e.g., the organic insulating layer. Accordingly, the first metal layer may not be provided substantially thick so as to prevent the diffusion of the second metal. In an exemplary embodiment, when the second metal layer includes aluminum when the barrier layer does not exist, the first metal layer is to be provided with a substantially thick thickness so as to prevent aluminum from being diffused into another layer, for example. However, in a case that the second metal layer includes aluminum when the barrier layer exist, the barrier layer additionally prevents aluminum from being diffused into another layer, and therefore, it is unnecessary to form the first metal layer to have a substantially thick thickness. Actually, when the barrier layer does not exist, the first metal layer including titanium, which has a thickness of about 700 Å, is desired to prevent the diffusion of aluminum. However, when the barrier layer exists, the diffusion of aluminum is sufficiently prevented using only the first metal layer including titanium, which has a thickness of about 500 Å or less.

In the line structure according to the exemplary embodiment of the invention, patterning is easily performed as compared with the typical line structures. According to the typical line structures, when a line is provided on an organic insulating layer, there frequently occurs a case where the organic insulating layer is excessively etched so as to prevent residues when the line is patterned. However, according to the exemplary embodiment of the invention, the barrier layer between the organic insulating layer and the line may be used as an etch stopper, and accordingly, patterning is easily performed on the line.

The line structure according to the exemplary embodiment of the invention shown in FIG. 1 may be manufactured by the following method. The following description relates to one of embodiments of the invention, and the line structure according to the exemplary embodiment of the invention may be variously modified without departing from the spirit and scope of the invention. In other exemplary embodiments, the inorganic insulating layer may be omitted or be provided in another region, for example. The position or shape of the organic insulating layer may be differently set. The line may be provided in a double layer or a quadruple or higher layer.

First, a substrate SUB is provided, and an inorganic insulating layer I-INS is disposed on the substrate SUB. The inorganic insulating layer I-INS may be provided by depositing, on the substrate SUB, an inorganic insulating material such as polysiloxane, silicon nitride, silicon oxide, or silicon oxynitride.

An organic insulating layer O-INS is disposed on the inorganic insulating layer I-INS. The organic insulating layer O-INS may be provided by coating, depositing, or printing, on the inorganic insulating layer I-INS, at least one organic insulating materials such as a polyimide-based compound, a polyacryl-based compound, a fluorine-based polymer compound including Teflon, a polyorganosiloxane-based compound, a benzocyclobutene-based compound, a phenol-based compound, an epoxy-based compound, polyamide-based compound, polyphenylene ether-based compound, or a polyphenylene sulfide-based compound. The organic insulating layer O-INS may be coated or printed in a specific pattern. In an alternative exemplary embodiment, the organic insulating layer O-INS may be disposed on the entire surface of the inorganic insulating layer I-INS and then patterned through photolithography using a mask.

A barrier layer BR and a first metal layer M1 of a line WR are disposed on the organic insulating layer O-INS.

The barrier layer BR and the first metal layer M1 may be disposed on the organic insulating layer O-INS by using a first metal. In an exemplary embodiment of the invention, the barrier layer BR and the first metal layer M1 may be provided through chemical vapor deposition, atomic layer deposition, physical vapor deposition, spacer patterning, or the like.

The barrier layer BR and the first metal layer M1 may be provided through a single process.

In an exemplary embodiment, when the barrier layer BR and the first metal layer M1 are provided through physical vapor deposition such as sputtering, a condition in which the first metal may be sufficiently oxidized may be maintained, for example. In an exemplary embodiment of the invention, a deposition condition of the first metal is changed such that, when the first metal is deposited on the organic insulating layer O-INS, a layer is disposed on the organic insulating layer O-INS as the first metal is oxidized. Thus, the barrier layer BR and the first metal layer M1 may be provided through a single process. In an exemplary embodiment, when the first metal layer M1 is provided through sputtering by using titanium as the first metal, deposition may be performed by applying power of about 10% to about 50% as compared with reference power when a general titanium layer is provided, for example. In this case, the barrier layer BR may be provided as oxidation of the first metal layer M1 occurs at a portion in direct contact with the organic insulating layer O-INS.

In an exemplary embodiment of the invention, the barrier layer BR and the first metal layer M1 may have a thickness within a specific range. In an exemplary embodiment, the barrier layer BR may have a thickness of about 10 Å to about 200 Å, for example. When the thickness of the barrier layer BR is provided less than about 10 Å, the oxygen content of a first metal oxide in the barrier layer BR may be decreased, and it is difficult that the barrier layer BR serves as an etch stopper. Actually, when the thickness of the barrier layer BR is 80 Å and the first metal is titanium, the content of titanium of the titanium oxide in the barrier layer BR is 83.0 at % and the content of oxygen of the titanium oxide in the barrier layer BR is 17.0 at %. Therefore, the barrier layer BR does not sufficiently serve as the etch stopper. When the thickness of the barrier layer BR is 130 Å and the first metal is titanium, the content of titanium of the titanium oxide in the barrier layer BR is 65.6 at % and the content of oxygen of the titanium oxide in the barrier layer BR is 34.4 at %. Thus, the barrier layer BR serves as the etch stopper.

After the aforementioned process, a second metal layer M2 and a third metal layer M3 are sequentially disposed on the first metal layer M1. The second metal layer M2 may also be provided through chemical vapor deposition, atomic layer deposition, physical vapor deposition, spacer patterning, or the like, for example.

Next, the first to third metal layers M1, M2, and M3 are patterned, thereby forming a line WR. The first to third metal layers M1, M2, and M3 may be provided through photolithography using a mask, for example. In this case, the barrier layer BR serve as an etch stopper on the organic insulating layer O-INS when the first to third metal layers M1, M2, and M3 are patterned. Accordingly, the first to third metal layers M1, M2, and M3 may be effectively patterned, and it is possible to prevent residues of the first metal layer M1 from being generated due to insufficient etching of the first metal layer M1. Furthermore, it is not desired to excessively etch the organic insulating layer O-INS up to an upper portion thereof.

In an exemplary embodiment of the invention, an additional insulating layer may be further provided on the line WR, when necessary. In the above-described exemplary embodiment, the line structure having one inorganic insulating layer I-INS and one organic insulating layer O-INS has been disclosed, but the invention is not limited thereto. The line structure according to the exemplary embodiment of the invention includes not only a line structure having a single organic insulating layer O-INS but also a line structure having three or more insulating layers of which at least one is the organic insulating layer O-INS.

That is, when a plurality of insulating layers is disposed on the substrate SUB, at least one of the plurality of insulating layers may be provided as the organic insulating layer O-INS, and the line WR may be provided on at least one of the plurality of insulating layers. In this case, the barrier layer BR may be provided only between the organic insulating layer O-INS and the line WR.

Figure 3:
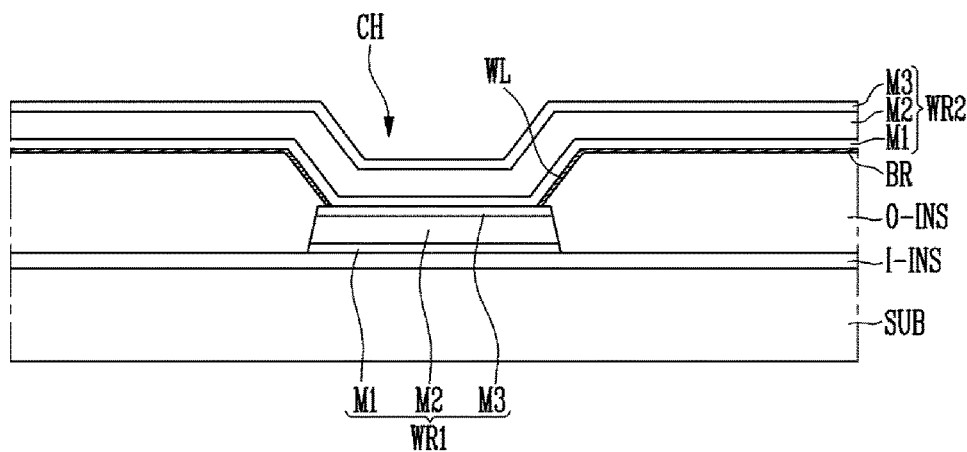
FIG. 3 is a sectional view illustrating a line structure according to an exemplary embodiment of the invention.

FIG. 3 is a sectional view illustrating a line structure according to an exemplary embodiment of the invention. A line structure when two different lines WR1 and WR2 are electrically connected to each other is illustrated in FIG. 3.

Referring to FIG. 3, when a plurality of lines are provided, the lines WR may include a first line WR1 and a second line WR2. Although not shown in the drawing, the first line WR1 and the second line WR2 may intersect each other in a plan view.

The first line WR1 is disposed on a substrate SUB. An inorganic insulating layer I-INS may be interposed between the first line WR1 and the substrate SUB. The inorganic insulating layer I-INS may be provided by depositing an inorganic insulating material on the substrate SUB.

The first line WR1 may be disposed on the inorganic insulating layer I-INS through chemical vapor deposition, atomic layer deposition, physical vapor deposition, spacer patterning, or the like, for example. The first line WR1 may be provided in a triple layer including first to third metal layers M1, M2, and M3. However, the invention is not limited thereto, and the first line WR1 may be provided in a single layer, a double layer, or a quadruple or higher layer, when necessary.

An organic insulating layer O-INS is disposed on the first line WR1. The organic insulating layer O-INS may be provided by coating, depositing, or printing an organic insulating material on the inorganic insulating layer I-INS, for example.

A contact hole CH that exposes a portion of an upper surface of the first line WR1 therethrough is defined in the organic insulating layer O-INS. In an exemplary embodiment of the invention, an upper surface of the third metal layer M3 of the first line WR1 may be partially exposed through the contact hole CH.

The organic insulating layer O-INS may be coated or printed in a region except a portion corresponding to the contact hole CH. In an alternative exemplary embodiment, the organic insulating layer O-INS may be disposed on the entire surface of the inorganic insulating layer I-INS and then patterned through photolithography using a mask, thereby defining the contact hole CH. An end portion of the organic insulating layer O-INS has a sidewall WL in the region in which the contact hole CH is defined.

Next, a barrier layer BR and the second line WR2 are disposed on the organic insulating layer O-INS. Here, the second line WR2 may include first to third metal layers M1, M2, and M3. However, the invention is not limited thereto, and the second line WR1 may be provided in a single layer, a double layer, or a quadruple or higher layer, when necessary.

In an exemplary embodiment of the invention, the second line WR2 may be provided as a metal different from that of the first line WR1. In an exemplary embodiment of the invention, the first to third metal layers M1, M2, and M3 of each of the first line WR1 and the second line WR2 may be independently provided as different metals, respectively, for example.

The barrier layer BR and the first metal layer M1 of the second line WR2 may be provided using a single process. In an exemplary embodiment, the barrier layer BR and the first metal layer M1 of the second line WR2 may be disposed on the organic insulating layer O-INS through a single process such as chemical vapor deposition, atomic layer deposition, physical vapor deposition, or spacer patterning.

When the barrier layer BR and the first metal layer M1 of the second line WR2 are provided through physical vapor deposition such as sputtering, a condition in which a first metal may be sufficiently oxidized may be maintained. In an exemplary embodiment of the invention, a deposition condition of a first metal of the second line WR2 is changed such that, when the first metal is deposited on the organic insulating layer O-INS, a layer is disposed on the organic insulating layer O-INS as the first metal is oxidized. Thus, the barrier layer BR and the first metal layer M1 may be provided through a single process. Through the process, the barrier layer BR is provided only between the first metal layer M1 of the second line WR2 and the organic insulating layer O-INS, and is not provided in a region in which the first metal layer M1 of the second line WR2 is not in contact with the organic insulating layer O-INS. Referring to FIG. 3, the barrier layer BR is disposed on the upper surface of the organic insulating layer O-INS and the sidewall WL of the contact hole CH, at which the first metal layer M1 of the second line WR2 is in contact with the organic insulating layer O-INS. However, the barrier layer BR is not provided between the first metal layer M1 of the second line WR2 and the third metal layer M3 of the first line WR1.

The first to third metal layers M1 to M3 of the second line WR2 are patterned through photolithography or the like, thereby finally forming the second line WR2.

In the illustrated exemplary embodiment, the second line WR2 and the first line WR1 are in direct contact with each other. In other words, the second line WR2 and the first line WR1 are in direct contact with each other through the first metal layer M1 of the second line WR2 and the third metal layer M3 of the first line WR1. Accordingly, the first line WR1 and the second line WR2 are electrically/physically connected to each other. As the first line WR1 and the second line WR2 are directly connected to each other, the resistance of a connection portion between the two lines WR1 and WR2 is very small.

The line structure according to the exemplary embodiment of the invention may be employed in various electronic devices, particularly, a display device. The display device includes pixels and a line part connected to the pixels, and at least one portion of the line part may have the above-described line structure. Hereinafter, an exemplary embodiment in which the above-described line structure is employed in the display device will be described.

Figure 4A:
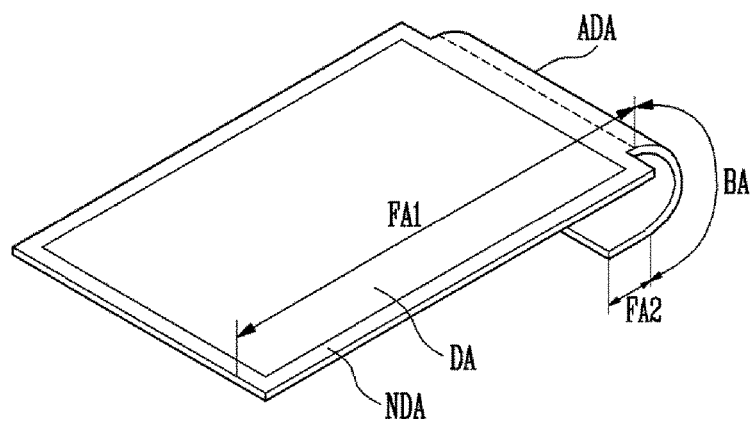
FIG. 4A is a perspective view illustrating a display device according to an exemplary embodiment of the invention.
Figure 4B:
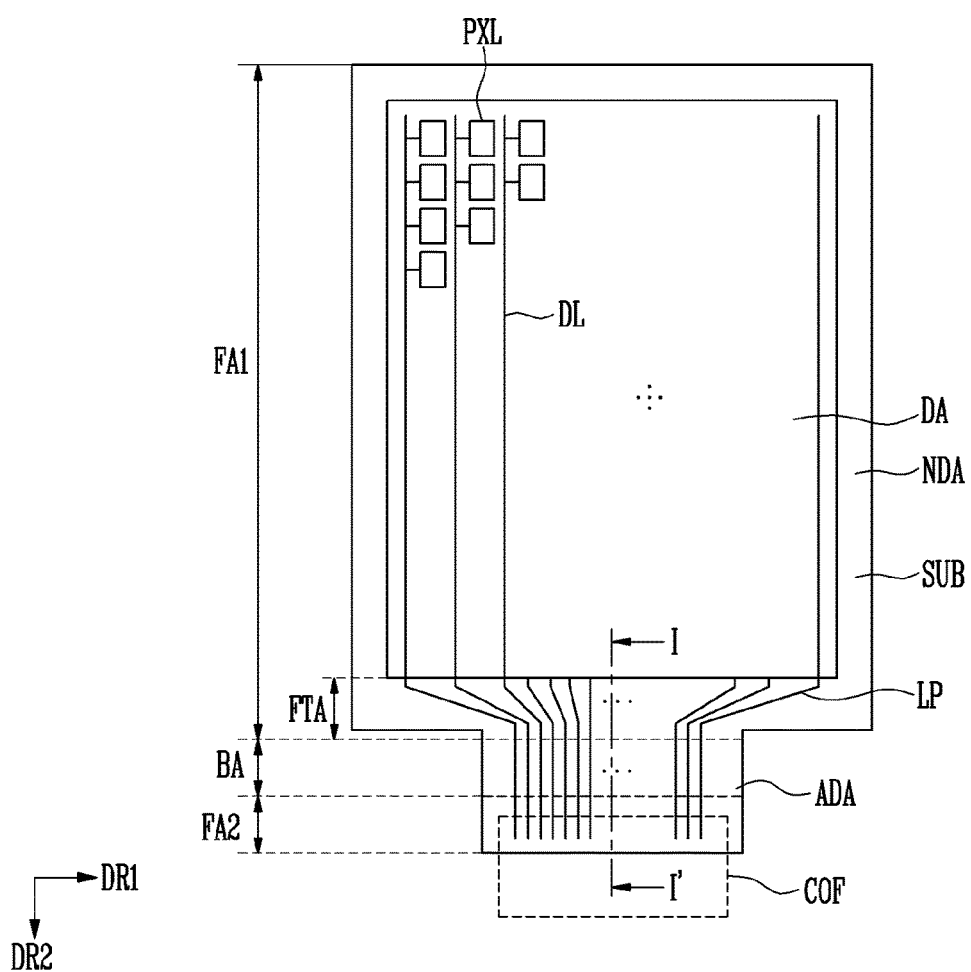
FIG. 4B is a plan view illustrating the display device of FIG. 4A.

FIG. 4A is a perspective view illustrating a display device according to an exemplary embodiment of the invention. FIG. 4B is a plan view illustrating the display device of FIG. 4A.

Referring to FIGS. 4A and 4B, at least one portion of the display device of the invention may have flexibility, and the display device may be folded at the portion having flexibility. That is, the display device may include a bent area BA that has flexibility and is bent in one direction, and a flat area (FA) that is provided at one side of the bent area BA and is flat without being folded. The flat area FA may have or not have flexibility.

In an exemplary embodiment of the invention, a case where the bent area BA is provided in an additional area ADA is illustrated as an example. According an exemplary embodiment of the invention, a first flat area FA1 and a second flat area FA2 may be provided, which are spaced apart from each other with the bent area BA interposed therebetween, and the first flat area FA1 may include a display area DA. In an exemplary embodiment of the invention, the bent area BA may be spaced apart from the display area DA.

In the bent area BA, when a line along which the display device is folded is referred to as a folding line, the folding line is provided in the bent area BA. Here, the term "folded" does not mean a fixed shape but means a shape deformable into another shape from the original shape, and includes a shape folded, curved, or rolled like a roll along one or more specific lines, i.e., one or more folding lines. Therefore, in an exemplary embodiment of the invention, a state in which a display device is folded such that surfaces of the two flat areas FA1 and FA2 are located in parallel to each other and are folded to face each other is illustrated. However, the invention is not limited thereto, and the display device may be folded such that surfaces of the two flat areas FA1 and FA2 define a predetermined angle (e.g., an acute angle, a right angle, or an obtuse angle) with the bent area BA interposed therebetween.

In an exemplary embodiment of the invention, the additional area ADA may be bent along the folding line in a subsequent process. In this case, as the additional area ADA is bent, the width of a bezel may be decreased.

The display device according to the exemplary embodiment of the invention includes a substrate SUB, pixels PXL provided on the substrate, and a line part LP connected to the pixels PXL.

The substrate SUB includes the display area DA and a non-display area NDA provided at one side of the display area DA.

The substrate SUB may have an approximately quadrangular shape, particularly, a rectangular shape. In an exemplary embodiment of the invention, the substrate SUB may include a pair of short sides parallel to each other in a first direction DR1 and a pair of long sides parallel to each other in a second direction DR2.

However, the shape of the substrate SUB is not limited thereto, and the substrate SUB may have various shapes. In an exemplary embodiment, the substrate SUB may be provided in various shapes such as a closed-shape polygon including linear sides, a circle, an ellipse, etc., including curved sides, and a semicircle, a semi-ellipse, etc., including linear and curved sides, for example. In an exemplary embodiment of the invention, when the substrate SUB has linear sides, at least some of corners of each of the shapes may be provided in a curve. In an exemplary embodiment, when the substrate SUB has a rectangular shape, a portion at which adjacent linear sides meet each other may be replaced with a curve having a predetermined curvature, for example. That is, a vertex portion of the rectangular shape may be provided with a curved side having both adjacent ends respectively connected to two adjacent linear sides, the curved side having a predetermined curvature. The curvature may be differently set depending on positions. In an exemplary embodiment, the curvature may be changed depending on a position at which the curve is started, a length of the curve, etc., for example.

The display area DA is an area in which a plurality of pixels PXL is provided to display an image. The display area DA may be provided in a shape corresponding to that of the substrate SUB. In an exemplary embodiment, like the shape of the substrate SUB, the display area DA may be provided in various shapes such as a closed-shape polygon including linear sides, a circle, an ellipse, etc., including curved sides, and a semicircle, a semi-ellipse, etc., including linear and curved sides, for example. In an exemplary embodiment of the invention, when the display area DA has linear sides, at least some of corners of each of the shapes may be provided in a curve.

The pixels PXL are provided on the display area DA of the substrate SUB. Each of the pixels PXL is a minimum unit for displaying an image, and may be provided in plurality. The pixels PXL may emit white light and/or color light. Each pixel PXL may emit light of one of red, green, and blue, but the invention is not limited thereto. In an exemplary embodiment, each pixel PXL may emit light of a color such as cyan, magenta, or yellow, for example.

Each of the pixels PXL may be a light emitting device including an organic emitting layer, but the invention is not limited thereto. In an exemplary embodiment, each of the pixels PXL may be implemented in various forms such as a liquid crystal device, an electrophoretic device, and an electrowetting device without departing from the spirit and scope of the invention, for example.

Figure 5A:
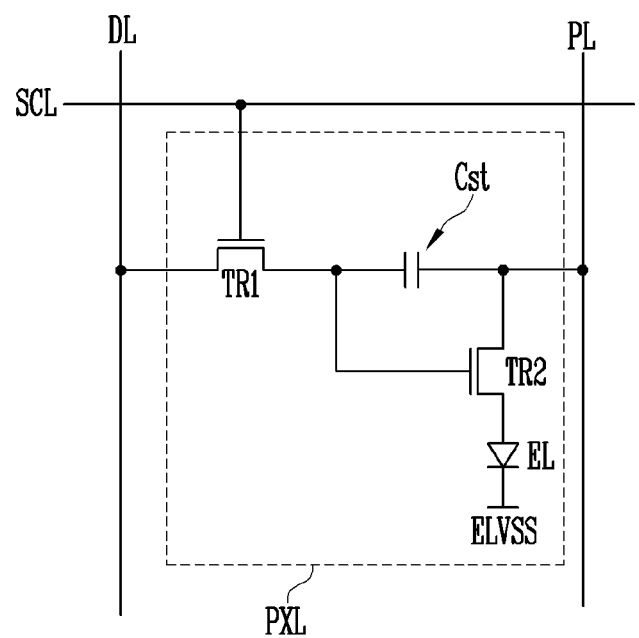
FIG. 5A is an equivalent circuit diagram illustrating a case where one pixel is a light emitting device according to an exemplary embodiment of the invention.
Figure 5B:
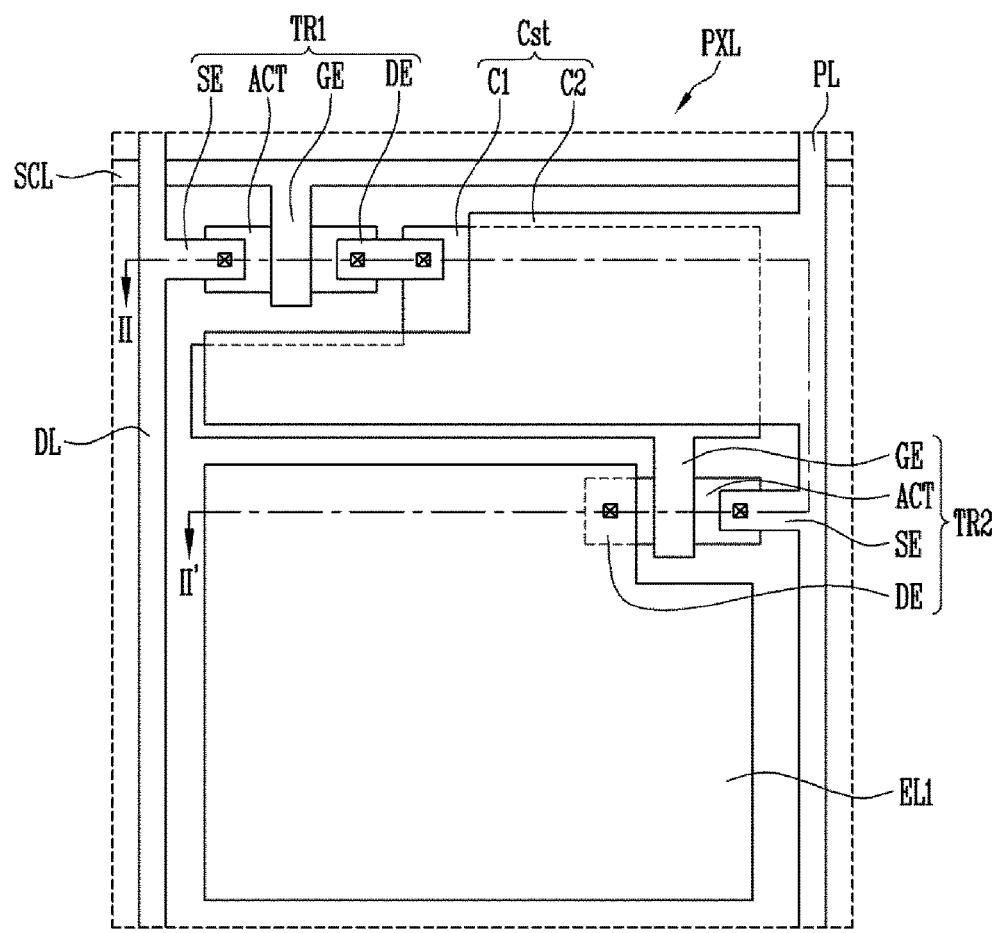
FIG. 5B is a plan view illustrating the pixel shown in FIG. 5A.
Figure 5C:
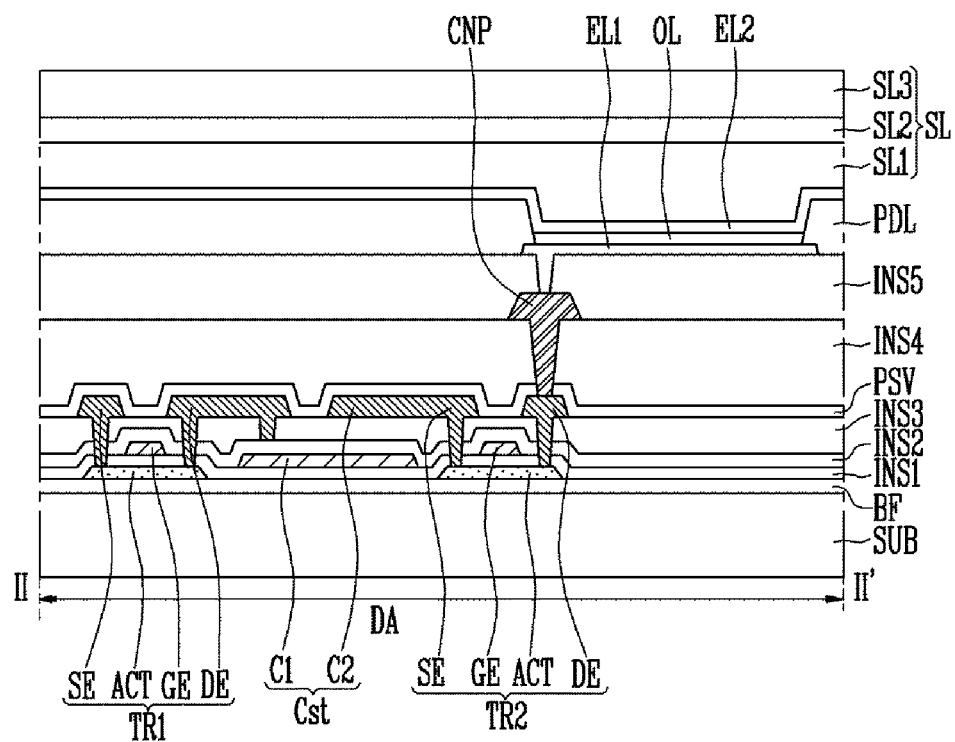
FIG. 5C is a sectional view taken along line II-II' of FIG. 5B.

FIG. 5A is an equivalent circuit diagram illustrating a case where one pixel PXL is a light emitting device according to an exemplary embodiment of the invention. FIG. 5B is a plan view illustrating the pixel shown in FIG. 5A. FIG. 5C is a sectional view taken along line II-IP of FIG. 5B.

First, referring to FIG. 5A, each pixel PXL includes a thin film transistor ("TFT") connected to a corresponding line in the line part, and a light emitting device EL connected to the TFT, and a capacitor Cst.

The TFT may include a second TFT TR2 for controlling the light emitting device EL and a first TFT TR1 that switches the second TFT TR2. In an exemplary embodiment of the invention, a case where one pixel PXL includes two TFTs TR1 and TR2 is illustrated. However, the invention is not limited thereto, and one TFT and one capacitor may be provided in one pixel PXL, or three or more TFTs and two or more capacitors may be provided in one pixel PXL. In an exemplary embodiment, one pixel may include seven TFTs, a light emitting device, and a storage capacitor, for example.

The first TFT TR1 includes a gate electrode, a source electrode, and a drain electrode. In the first TFT TR1, the gate electrode is connected to a scan line SCL, and the source electrode is connected to a data line DL. The drain electrode is connected to a gate electrode of the second TFT TR2. The first TFT TR1 transmits a data signal applied to the data line DL to the second TFT TR2 according to a scan signal applied to the scan line SCL.

The second TFT TR2 includes the gate electrode, a source electrode, and a drain electrode. In the second TFT TR2, the gate electrode is connected to the first TFT TR1, and the source electrode is connected to a first power line PL. The drain electrode is connected to the light emitting device EL.

The light emitting device EL includes an emitting layer, and first and second electrodes are opposite to each other with the emitting layer interposed therebetween. The first electrode is connected to the drain electrode of the second TFT TR2. A second power line ELVSS is connected to the second electrode of the light emitting device EL to apply a common voltage applied therethrough. The emitting layer emits or does not emit light according to an output signal of the second TFT TR2, thereby displaying image. Here, the light emitted from the emitting layer may be changed depending on materials of the emitting layer, and be colored light or white light, for example.

The capacitor Cst is connected between the gate electrode and the source electrode of the second TFT TR2, and charges and maintains a data signal input to the gate electrode of the second TFT TR2.

Referring to FIGS. 5A to 5C, the pixel PXL according to the exemplary embodiment of the invention will be described according to a stack structure.

The pixel PXL is provided on a substrate SUB.

The substrate SUB may include an insulative material such as glass or resin. Also, the substrate SUB may include a material having flexibility to be bendable or foldable. The substrate SUB may have a single- or multi-layered structure.

A buffer layer BF is disposed on the substrate SUB. The buffer layer BF prevents impurities from being diffused into switching and driving transistors. The buffer layer BF may be provided as a single layer, but be provided as a multi-layer including at least two layers.

The buffer layer BF may be an inorganic insulating layer including an inorganic material. In an exemplary embodiment, the buffer layer BF may include silicon nitride, silicon oxide, silicon oxynitride, etc., for example. When the buffer layer BF is provided as a multi-layer, layers of the multi-layer may include materials equal to or different from each other. The buffer layer BF may be omitted according to material and process conditions.

Active patterns ACT are provided on the buffer layer BF. The active patterns ACT include a semiconductor material. Each of the active patterns may include a source region, a drain region, and a channel region provided between the source region and the drain region. In an exemplary embodiment, the active pattern ACT may be a semiconductor pattern including poly-silicon, amorphous silicon, oxide semiconductor, etc. The channel region is a semiconductor pattern undoped with impurities, and may be an intrinsic semiconductor. The source region and the drain region are semiconductor patterns dope with impurities. The impurities may include impurities such as an n-type impurity, a p-type impurity, and other metals.

A first insulating layer INS1 that covers the active patterns ACT may be disposed on the substrate SUB and the active patterns ACT. The first insulating layer INS1 may insulate the active pattern ACT from gate electrode GE.

A scan line SCL extending in one direction, the gate electrodes GE, and a first capacitor electrode C1 of a capacitor Cst may be disposed on the first insulating layer INS1.

A second insulating layer INK and a third insulating layer INS3 may be disposed on the first insulating layer INS1, the scan line SCL, the gate electrodes GE, and the first capacitor electrode C1. Portions of the second insulating layer INS2 and the third insulating layer INS3 may be removed, to expose source and drain regions of the active patterns ACT therethrough.

A data line DL that intersects the scan line SCL to be insulated from the scan line SCL, a power supply line PL disposed to be spaced apart from the data line DL, a second capacitor electrode C2 of the capacitor Cst, and source and drain electrode SE and DE may be disposed on the second insulating layer INK.

The source and drain electrodes SE and DE may be insulated from the gate electrodes GE by the second insulating layer INK. In addition, the source and drain electrodes SE and DE may be connected to the source and drain regions, respectively.

The capacitor Cst may include the first capacitor electrode C1 and the second capacitor electrode C2. The first capacitor electrode C1 may include the same material as that of the scan line SCL and the gate electrode GE, and be disposed in the same layer as the scan line SCL and the gate electrode GE.

The second capacitor electrode C2 may include the same material as the data line DL, the power supply line PL, and the source and drain electrodes SE and DE, and be disposed on the same layer the data line DL, the power supply line PL, and the source and drain electrodes SE and DE.

A passivation layer PSV and a fourth insulating layer INS4 may be disposed on the substrate on which a first TFT TR1, a second TFT TR2, and the capacitor Cst are disposed. A contact hole that exposes a portion of the drain electrode DE of the second TFT TR2 therethrough may be defined in the passivation layer PSV and the fourth insulating layer INS4. The passivation layer PSV may be omitted in some exemplary embodiments.

A fifth insulating layer INS5 may be disposed on the fourth insulating layer INS4. A connection line CNP connected to the drain electrode DE of the second TFT TR2 through the contact hole of the fourth insulating layer INS4 may be provided in the fifth insulating layer INS5. In an exemplary embodiment of the invention, the fifth insulating layer INS5 and the connection line CNP may be omitted, when necessary.

A light emitting device EL is connected to the connection line CNP.

In the illustrated exemplary embodiment, a case where both of the first TFT TR1 and the second TFT TR2 are TFTs having a top gate structure is described as an example, but the invention is not limited thereto. In an exemplary embodiment, at least one of the first TFT TR1 and the second TFT TR2 may be a TFT having a bottom gate structure, for example. In an exemplary embodiment of the invention, it is illustrated that two TFTs and one capacitor are provided, but the invention is not limited thereto. In other exemplary embodiments, it will be apparent that TFTs and capacitors, of which number is different from that of the two TFTs and the one capacitor, may be provided.

A first electrode EL1 may be provided on the fifth insulating layer INS5. The first electrode EL1 is connected to the connection line CNP through a through-hole passing through the fifth insulating layer INS5, and is connected to the drain electrode DE through the contact hole passing through the fourth insulating layer INS4 and the passivation layer PSV. Thus, the first electrode EL1 is connected to the TFT. Here, the first electrode EL1 may be used as one of an anode and a cathode in some exemplary embodiments.

In an exemplary embodiment, the first electrode EL1 may include a metal layer such as Ag, Mg, Al, Pt, Au, Ni, Nd, Ir, Cr, or any alloy thereof and/or indium tin oxide ("ITO"), indium zinc oxide ("IZO"), zinc oxide (ZnO), indium tin zinc oxide ("ITZO"), etc.

In an exemplary embodiment of the invention, the first electrode EL1 may include a kind of metal. However, the invention is not limited thereto, and the first electrode EL1 may include an alloy of two or more kinds of metals, e.g., Ag and Mg.

When an image is to be provided in the lower direction of the substrate SUB, the first electrode EL1 may be provided as a transparent conductive layer. When an image is to be provided in the upper direction of the substrate SUB, the first electrode EL1 may be provided as a metal reflective layer and/or a transparent conductive layer.

A pixel defining layer PDL that defines a pixel region to correspond to each pixel PXL may be provided on the substrate SUB on which the first electrode EL1 and the like are provided. In an exemplary embodiment, the pixel defining layer PDL may be an organic insulating layer including an organic material, for example. In an exemplary embodiment, the organic material may include at least one of organic insulating materials such as a polyimide-based compound, a polyacryl-based compound, a fluorine-based polymer compound including Teflon, a polyorganosiloxane-based compound, a benzocyclobutene-based compound, a phenol-based compound, an epoxy-based compound, polyamide-based compound, polyphenylene ether-based compound, or a polyphenylene sulfide-based compound.

The pixel defining layer PDL exposes an upper surface of the first electrode EL1 and protrudes from the substrate SUB along the circumference of the pixel PXL.

An organic emitting layer OL may include a low-molecular or high-molecular material. In an exemplary embodiment, the low-molecular material may include at least one of copper phthalocyanine (CuPc), N,N-Di(naphthalene-1-yl)-N,N-diphenyl-benzidine ("NPB"), tris-8-hydroxyquinoline aluminum (Alq$_3$), and the like, for example. These materials may be provided through vacuum deposition. In an exemplary embodiment, the high-molecular material may include at least one of poly(3,4-ethylenedioxythiophene ("PEDOT")-, poly(phenylene-vinylene) ("PPV")-, poly(fluorine)-based materials, for example.

The organic emitting layer OL may be provided as a single layer, but may be provided as a multi-layer including various functions. When the organic emitting layer OL is provided as a multi-layer, the organic emitting layer OL may have a structure in which a hole injection layer, a hole transport layer, an emission layer, an electron transport layer, an electron injection layer, and the like are stacked in a single or complex structure. In an exemplary embodiment, the organic emitting layer OL may be provided through evaporation, screen printing, inkjet printing, laser induced thermal imaging ("LITI"), or the like, for example.

The organic emitting layer OL is not necessarily limited thereto, and it will be apparent that the organic emitting layer OL may have various structures. In addition, at least one portion of the organic emitting layer OL may be unitary throughout a plurality of first electrodes EL1, or be individually provided to respectively correspond to a plurality of first electrodes EL1.

A second electrode EL2 is provided on the organic emitting layer OL. The second electrode EL2 may be provided for every pixel PXL, but be provided to cover a majority of the display area DA. The second electrode EL2 may be shared by a plurality of pixels.

In some exemplary embodiments, the second electrode EL2 may be used as one of the anode and the cathode. When the first electrode EL1 is the anode, the second electrode EL2 may be used as the cathode, for example. When the first electrode EL1 is the cathode, the second electrode EL2 may be used as the anode, for example.

In an exemplary embodiment, the second electrode EL2 may include a metal layer such as Ag, Mg, Al, Pt, Pd, Au, Ni, Nd, Ir, Cr, or any alloy thereof and/or a transparent conductive layer such as ITO, IZO, zinc oxide (ZnO), or ITZO. In an exemplary embodiment of the invention, the second electrode EL2 may be provided as a multi-layer of two or more layers including a metal thin film. In an exemplary embodiment, the second electrode EL2 may be provided as a triple layer of ITO/Ag/ITO.

When an image is to be provided in the lower direction of the substrate SUB, the second electrode EL2 may be provided as a metal reflective layer and/or a transparent conductive layer. When an image is to be provided in the upper direction of the substrate SUB, the second electrode EL2 may be provided as a transparent conductive layer.

An encapsulation layer SL is provided on the second electrode EL2. The encapsulation layer SL may be provided as a single layer, but be provided as a multi-layer. In an exemplary embodiment of the invention, the encapsulation layer SL may include first to third encapsulation layers SL1 to SL3. The first to third encapsulation layers SL1 to SL3 may include an organic material and/or an inorganic material. The third encapsulation layer SL3 located at the outermost portion may include an inorganic material.

In an exemplary embodiment of the invention, the first encapsulation layer SL1 may include an inorganic material, the second encapsulation layer SL2 may include an organic material or an inorganic material, and the third encapsulation layer SL3 may include an inorganic material. As compared with the organic material, moisture or oxygen less penetrates into the inorganic material, but the inorganic material is weak to cracks due to its small elasticity or flexibility. The first encapsulation layer SL1 and the third encapsulation layer SL3 include an inorganic material, and the second encapsulation layer SL2 includes an organic material, so that the propagation of cracks may be prevented. Here, when the second encapsulation layer SL2 includes an organic material, the second encapsulation layer SL2 may be completely covered by the third encapsulation layer SL3 such that an end portion of the second encapsulation layer SL2 is not exposed to the outside.

In an exemplary embodiment, the organic material may include at least one of organic insulating materials such as a polyimide-based compound, a polyacryl-based compound, a fluorine-based polymer compound including Teflon, a polyorganosiloxane-based compound, a benzocyclobutene-based compound, a phenol-based compound, an epoxy-based compound, polyamide-based compound, polyphenylene ether-based compound, or a polyphenylene sulfide-based compound. The inorganic material may include polysiloxane, silicon nitride, silicon oxide, silicon oxynitride, etc. When the second encapsulation layer SL2 includes an inorganic material instead of an organic material, the inorganic material may include various silicon-based insulating materials, e.g., hexamethyldisiloxane ("HMDSO"), octamethylcyclotetrasiloxane ("OMCTSO"), tetramethyldisiloxane ("TMDSO"), tetraethyleorthosilicate ("TEOS"), and the like. In an exemplary embodiment of the invention, the organic emitting layer OL constituting a light emitting device may be easily damaged by moisture or oxygen from the outside. The encapsulation layer SL protects the organic emitting layer OL by covering the organic emitting layer OL. The encapsulation layer SL covers the display area DA, and may extend up to the outside of the display area DA.

Referring back to FIGS. 4A and 4B, the non-display area NDA is an area in which the pixels PXL are not provided, and any image is not displayed in the non-display area NDA.

The non-display area NDA may further include the additional area ADA that protrudes from a portion thereof. The additional area ADA may protrude from sides constituting the non-display area NDA. In an exemplary embodiment of the invention, a case where the additional area ADA protrudes from a side corresponding to the short sides of the substrate SUB is illustrated as an example. However, the additional area ADA may protrude from one of the long sides of the substrate SUB, or be provided in a shape protruding from two sides among the four sides of the substrate SUB. In an exemplary embodiment of the invention, a data driver may be provided or connected to the additional area ADA. However, the invention is not limited thereto, and various components may be disposed in the additional area ADA.

The non-display area NDA may include a fan-out area FTA located between the display area DA and the bent area BA, and accordingly, the display area DA, the fan-out area FTA, and the bent area BA are sequentially disposed.

The fan-out area FTA is a portion at which the line part of the display area DA extends to the bent area BA. Lines extending along the first direction DR1 in the display area DA are provided in a fan shape in which the distance between the lines is gradually narrowed in the fan-out area FTA.

In an exemplary embodiment of the invention, the line part LP may include various types of lines, and their kinds are not limited. In an exemplary embodiment, the line part LP provides signals to each pixel PXL, and may include scan lines, data lines, a power poser line, a second power line, and the like, for example. The line part LP may further include other lines, when necessary. At least some of the lines constituting the line part LP have the line structure according to the above-described exemplary embodiment.

In an exemplary embodiment of the invention, a case where the lines of the line part LP are data lines DL is illustrated as an example, but this is provided for convenience of description.

In an exemplary embodiment of the invention, the data lines DL may substantially extend in the second direction DR2 and be spaced apart from each other. As the data lines DL extends in the second direction DR2, the distance between adjacent data lines DL may be gradually narrowed or widened. In an exemplary embodiment of the invention, the distance between data lines DL adjacent to each other along the second direction DR2 may be gradually narrowed in the fan-out area FTA.

The data lines DL connected to the pixels PXL and a driver (not shown) connected to the data lines DL to drive the pixels PXL may be provided in the non-display area NDA.

The data lines DL may be provided throughout the display area DA and the non-display area NDA. In particular, the data lines DL may extend up to the second flat area FA2 via the fan-out area FTA in the non-display area NDA.

The data lines DL are connected to the driver (not shown). The driver may be connected to an end portion of the line part LP. The driver provides signals to each pixel PXL through the data lines DL, and accordingly controls driving of each pixel PXL.

The driver may include a scan driver (not shown) that provides a scan signal to each pixel PXL along scan lines SCL (refer to FIGS. 5A and 5B), a data driver (not shown) that provides a data signal to each pixel PXL along the data lines DL, a timing controller (not shown) that controls the scan driver and the data driver, and the like.

In an exemplary embodiment of the invention, the scan driver may be directly disposed (e.g., mounted) on the substrate SUB. When the scan driver is directly disposed (e.g., mounted) on the substrate SUB, the scan driver may be provided together with the pixels PXL in a process of forming the pixels PXL. However, the mounting position and forming method of the scan driver are not limited thereto. In an exemplary embodiment, the scan driver may be disposed on a separate chip to be provided in a chip on glass ("COG") form on the substrate SUB, for example. In an alternative exemplary embodiment, the scan driver may be disposed (e.g., mounted) on a printed circuit board ("PCB") to be connected to the substrate SUB through a connection member.

In an exemplary embodiment of the invention, the data driver may be directly disposed (e.g., mounted) on the substrate SUB. However, the invention is not limited thereto, and the data driver may be disposed on a separate chip to be connected to the substrate SUB. In an exemplary embodiment of the invention, when the data driver is disposed on a separate chip to be connected to the substrate SUB, the data driver may be provided in the form of a COG or a chip on plastic, for example. In an alternative exemplary embodiment, the data driver may be disposed (e.g., mounted) on a PCB to be connected to the substrate SUB through a connection member. In an exemplary embodiment of the invention, the data driver may be provided in the form of a chip on film ("COF") to be connected to the substrate SUB.

Figure 6:
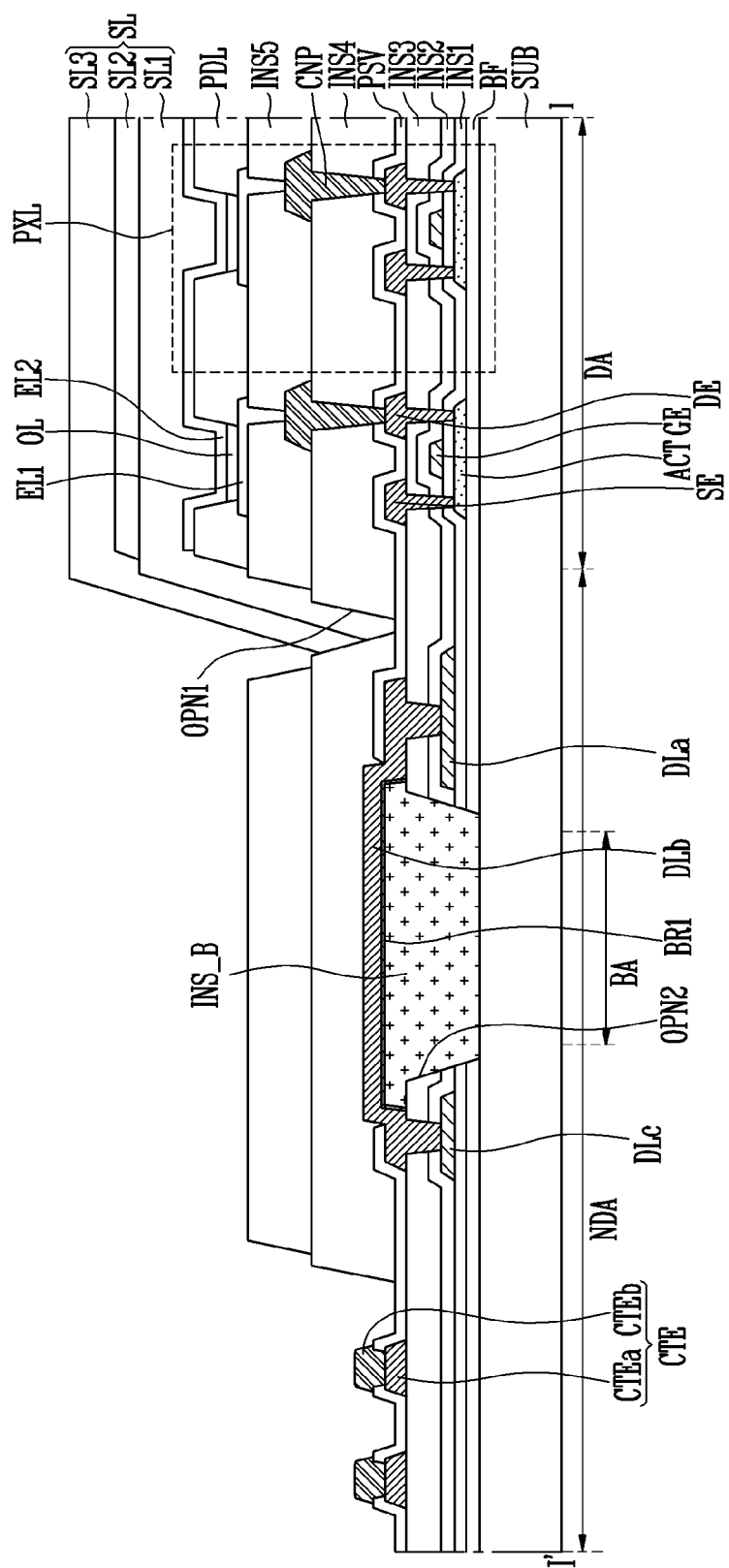
FIG. 6 is a sectional view taken along line I-I' of FIG. 4B.

FIG. 6 is a sectional view taken along line I-I' of FIG. 4B. Some pixels in the display area DA and the non-display area NDA are illustrated in FIG. 6. FIG. 6 conceptually illustrates the display device according to the exemplary embodiment of the invention, and some components are exaggerated or reduced for convenience of description.

The display device according to the exemplary embodiment of the invention has a shape in which a portion of the display device is bent as shown in FIG. 4A. However, for convenience of description, a state in which the display device is not bent is illustrated in FIG. 6.

Hereinafter, the display device according to the exemplary embodiment of the invention will be described in detail with reference to FIGS. 4A, 4B, 5A to 5C, and 6. The pixels PXL of the display area DA has already described above, and therefore, the non-display area NDA will be mainly described. In the description of the non-display area NDA, contents that have already described above will be omitted or briefly described to avoid redundancy.

In an exemplary embodiment of the invention, the line part LP may be provided in the non-display area NDA. The line part LP includes the data lines DL, and connects the pixels PXL to the driver. In an exemplary embodiment of the invention, the data lines DL may connect the pixels PXL to the driver. To this end, the data lines DL may substantially extend in the second direction DR2 from the pixels PXL. The data lines DL may extend up to an end portion of the additional area ADA in the second direction DR2, and contact electrodes CTE may be provided at the end portion. The pixels PXL may be connected to the driver implemented in the form of a COF through the contact electrodes CTE connected to lines.

The non-display area NDA has the bent area BA in which the substrate SUB is bent.

The data lines DL are provided throughout the bent area BA, and may include a first data line DLa disposed between the bent area BA and the display area DA, a second data line DLb disposed in the bent area BA, and a third data line DLc disposed posterior to the bent area BA.

The buffer layer BF is provided on the substrate SUB.

The first to fifth insulating layers INS1 to INS5 are sequentially provided on the buffer layer BF. In an exemplary embodiment, the first to third insulating layers INS1 to INS3 may be inorganic insulating layers, and the fourth insulating layer INS4 and the fifth insulating layer INS5 may be organic insulating layers, for example.

Here, a second opening OPN2 is defined in the insulating layers provided in the bent area BA. The bent area BA is an area in which the substrate SUB is bent. That is, portions corresponding to the bent area BA are removed in the buffer layer BF, the first insulating layer INS1, the second insulating layer INS2, and the third insulating layer INS3 to define the second opening OPN2. In other exemplary embodiments, the portions corresponding to the bent area BA may not be removed in some of the buffer layer BF, the first insulating layer INS1, the second insulating layer INS2, and the third insulating layer INS3. In an exemplary embodiment, the portion corresponding to the bent area BA may not be removed in the buffer layer BF, and the portions corresponding to the bent area BA are removed in the other insulating layers, i.e., the first insulating layer INS1, the second insulating layer INS2, and the third insulating layer INS3 to define the second opening OPN2, for example.

That the second opening OPN2 corresponds to the bent area BA may be understood as that the second opening OPN2 overlaps with the bent area BA. An area of the second opening OPN2 may be wider than that of the bent area BA. In an exemplary embodiment of the invention, it is illustrated that a width of the second opening ONP2 is wider than that of the bent area BA. However, this is provided for convenience of description, and the width of the second opening ONP2 may be equal to or different from that of the bent area BA.

In an exemplary embodiment of the invention, it is illustrated that the bent area BA exists in a portion at which the inorganic insulating layer is removed. However, this is provided for convenience of description, and the bent area BA may correspond to the portion at which the inorganic insulating layer is removed. In exemplary embodiments, the bent area BA substantially corresponds to the portion at which the inorganic insulating layer is removed, but may be equal to, wider than, or narrower than the portion at which the inorganic insulating layer is removed, when necessary, for example. In an exemplary embodiment of the invention, it is illustrated that the bent area BA is located in only the non-display area NDA, but the invention is not limited thereto. In an exemplary embodiment, the bent area BA may be provided throughout the non-display area NDA and the display area DA, for example. In addition, the bent area BA may be provided in the display area DA.

For reference, in FIG. 5C, it is illustrated that inner surfaces of the buffer layer BF, the first insulating layer INS1, the second insulating layer INS2, and the third insulating layer INS3 all correspond to one another to be disposed on a straight line, but the invention is not limited thereto. In an exemplary embodiment, the second opening OPN2 of the third insulating layer INS3 may be provided to have an area wider than that of the second opening OPN2 of the buffer layer BF, for example. In an exemplary embodiment of the invention, the second opening OPN2 of the buffer layer BF may be defined to have the narrowest area among the second opening OPN2 of the first insulating layer INS1, the second opening OPN2 of the second insulating layer INS2, and the second opening OPN2 of the third insulating layer INS3.

A bent part insulating layer INS_B is provided in the second opening OPN2. The bent part insulating layer INS_B fills in at least one portion of the second opening OPN2, and it is illustrated in FIG. 6 that the bent part insulating layer INS_B is filled in the entire second opening OPN2. In an exemplary embodiment of the invention, the bent part insulating layer INS_B may fill in the second opening OPN2 and simultaneously cover a region adjacent to the second opening OPN2, e.g., a portion of an upper portion of the third insulating layer INS3, corresponding to the first flat area FA1 and the second flat area FA2.

The passivation layer PSV may be provided on the substrate SUB. The passivation layer PSV may be an inorganic insulating layer. At this time, the passivation layer PSV is not provided in an area corresponding to the bent area, such as the above-described insulating layers (the buffer layer BF, the first insulating layer INS1, the second insulating layer INS2, and/or the third insulating layer INS3). In addition, the passivation layer PSV exposes a portion of the upper surface of a lower contact electrode CTEa.

The fourth insulating layer INS4 may be provided on the passivation layer PSV. The fifth insulating layer INS5 may be provided on the fourth insulating layer INS4. A first opening OPN1 is defined in the fourth insulating layer INS4 and the fifth insulating layer INS5 as portions of the fourth insulating layer INS4 and the fifth insulating layer INS5 are removed along the circumference of the display area DA. Accordingly, the fourth insulating layer INS4 and the fifth insulating layer INS5 do not continuously extend from the display area DA to the non-display area NDA.

In an exemplary embodiment of the invention, the upper surface of the pixel defining layer PDL and the side surfaces of the fourth insulating layer INS4, the fifth insulating layer INS5, and/or the pixel defining layer PDL, which are exposed by the portion at which the first opening OPN1 is provided, are encapsulated by an insulating layer including an inorganic material, e.g., the encapsulation layer SL, so that the exposure to the outside is prevented. Whether the encapsulation layer SL is provided as a multi-layer or the material of the encapsulation layer is not limited thereto, and may be variously changed. In an exemplary embodiment, the encapsulation layer SL may include a plurality of organic material layers and a plurality of inorganic material layers, which are alternately stacked, for example. As described above, the side surfaces of the fourth insulating layer INS4 and the fifth insulating layer INS5, provided in the display area DA, are covered by the encapsulation layer SL. However, all of the upper surface of the fifth insulating layer INS5 and the side surfaces of the fifth insulating layer INS5 and the fourth insulating layer INS4, which are provided in the non-display area NDA, are not necessarily covered by the encapsulation layer SL, and at least one portion may be exposed to the outside.

The lower contact electrode CTEa may be provided on the third insulating layer INS3, and an upper contact electrode CTEb may be provided on the lower contact electrode CTEa. The upper contact electrode CTEb may include the same material through the same process as that of the connection line CNP of the display area DA. The lower contact electrode CTEa and the upper contact electrode CTEb constitute a contact electrode CTE, and lines may be connected to the driver implemented in the form of COF, a PCB, or the like through the contact electrode CTE.

In an exemplary embodiment of the invention, the first to fourth insulating layers INS1, INS2, INS3, and INS4 and the passivation layer PSV may be provided as inorganic insulating layers, and the bent part insulating layer INS_B may be provided as an organic insulating layer including an organic material. Here, a line provided on the bent part insulating layer INS_B may have the line structure described in FIGS. 1 and 3.

That is, in an exemplary embodiment, the bent part insulating layer INS_B may include at least one of organic insulating materials such as a polyimide-based compound, a polyacryl-based compound, a fluorine-based polymer compound including Teflon, a benzocyclobutene-based compound, a phenol-based compound, an epoxy-based compound, polyamide-based compound, polyphenylene ether-based compound, or a polyphenylene sulfide-based compound, and the second data line DLb is provided on the bent part insulating layer INS_B with a first barrier layer BR1 interposed therebetween. The second data line DLb may include first to third metal layers, and the first barrier layer BR1 may be provided between the bent part insulating layer INS_B and the first metal layer.

The second data line DLb disposed on the bent part insulating layer INS_B has the line structure according to the exemplary embodiment of the invention. Thus, in the line structure according to the exemplary embodiment of the invention, corrosion of the line is prevented as compared with the typical line structures. Furthermore, in the line structure according to the exemplary embodiment of the invention, patterning is easily performed as compared with the typical line structures.

In an exemplary embodiment of the invention, the line structure may be employed in various layers. In the following embodiments, differences from the above-described exemplary embodiment will be mainly described to avoid redundancy, and undescribed portions will be appreciated by referring to the above-described exemplary embodiment.

Figure 7:
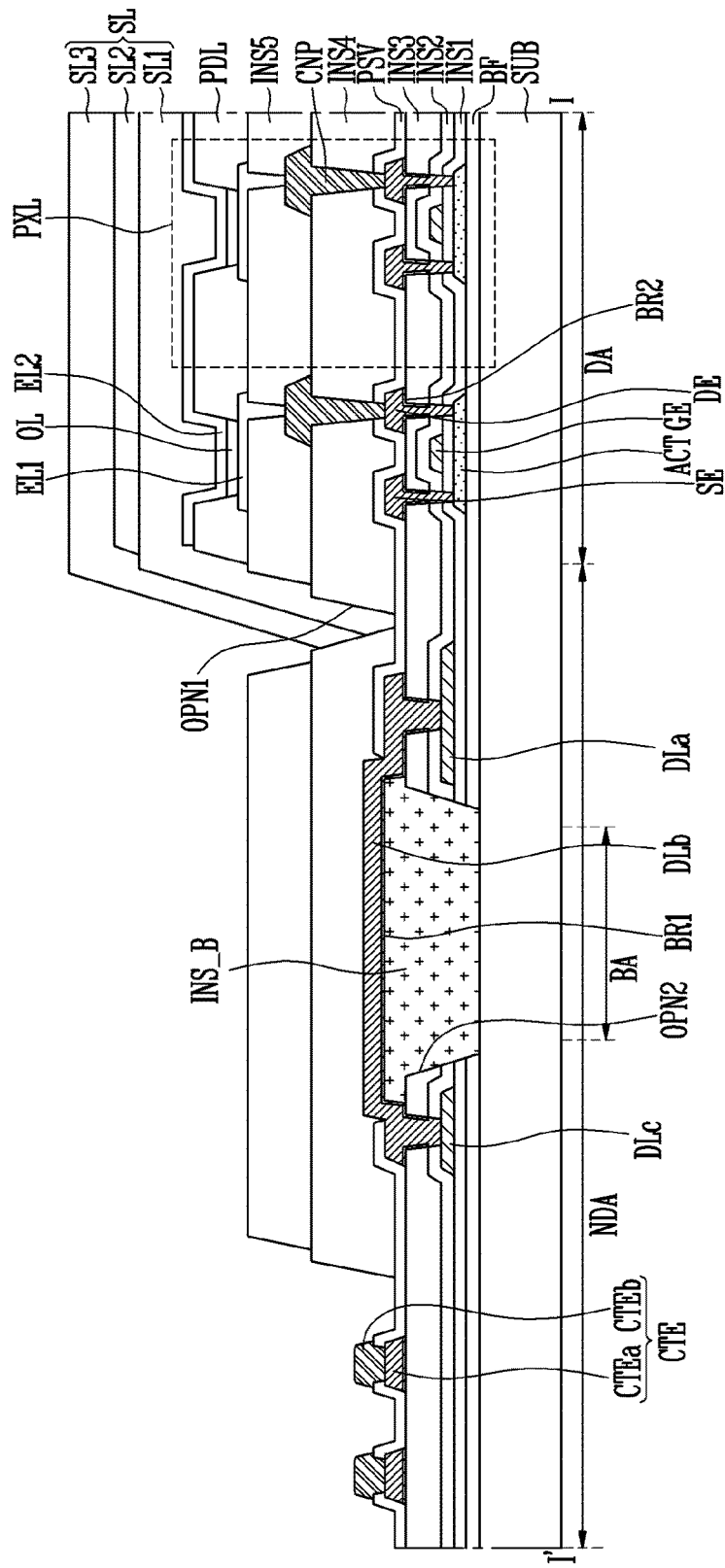
FIGS. 7 to 9 are sectional views of display devices according to exemplary embodiments of the invention, which illustrate sectional views taken along line I-I' of FIG. 4B.
Figure 8:
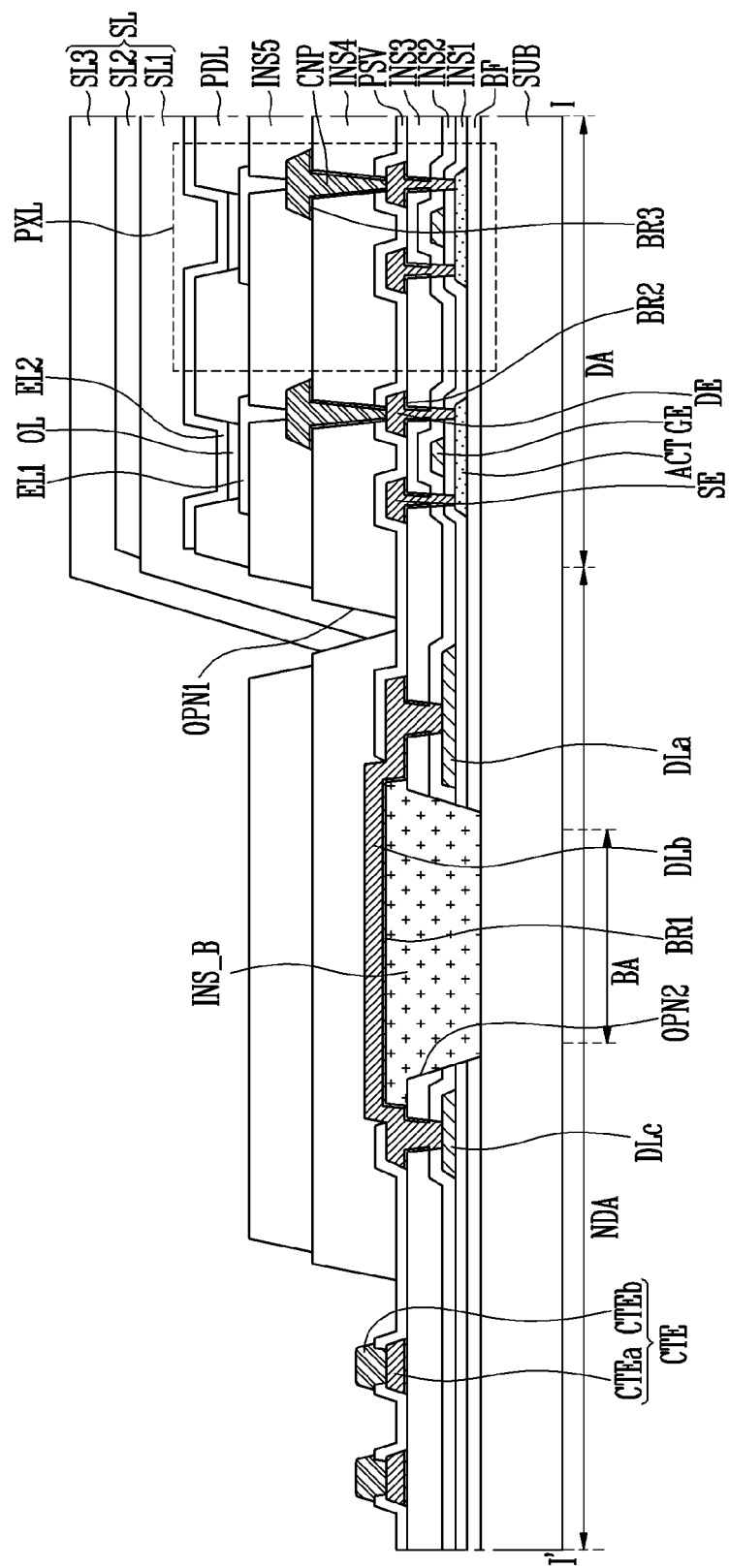
Figure 9:
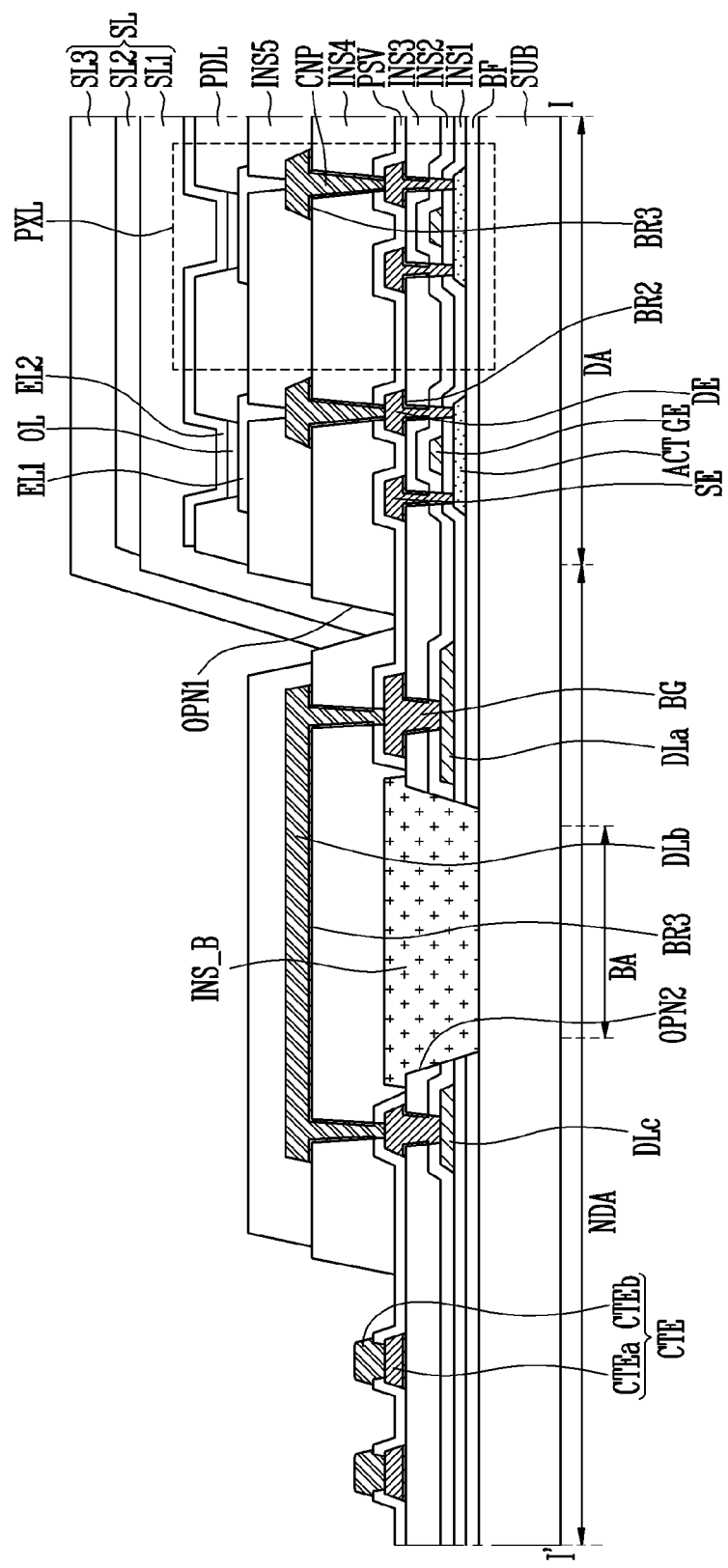

FIGS. 7 to 9 are sectional views of display devices according to exemplary embodiments of the invention, which illustrate sectional views taken along line I-I' of FIG. 4B.

Referring to FIG. 7, in the illustrated exemplary embodiment, the bent part insulating layer INS_B and the third insulating layer INS3 may be provided as organic insulating layers, and a line disposed on the bent part insulating layer INS_B and the third insulating layer INS3 may be provided in the line structure according to the exemplary embodiment of the invention.

In an exemplary embodiment, each of the source electrode SE, the drain electrode DE, and the data line DL (refer to FIGS. 4B, 5A and 5B) may be provided to include first to third metal layers, for example. In this case, the first barrier layer BR1 may be provided between the bent part insulating layer INS_B and the second data line DLb in the non-display area NDA, and the second barrier layer BR2 may be provided between the third insulating layer INS3 and the source electrode SE, between the third insulating layer INS3 and the drain electrode DE, and between the third insulating layer INS3 and the data line DL in the display area DA.

Referring to FIG. 8, in the illustrated exemplary embodiment, the bent part insulating layer INS_B, the third insulating layer INS3, and the fourth insulating layer INS4 may be provided as organic insulating layers, and a line disposed on the bent part insulating layer INS_B, the third insulating layer INS3, and the fourth insulating layer INS4 may be provided in the line structure according to the exemplary embodiment of the invention. In an exemplary embodiment, each of the source electrode SE, the drain electrode DE, the data line, and the connection line CNP may be provided to include first to third metal layers, for example. In this case, the first barrier layer BR1 may be provided between the bent part insulating layer INS_B and the second data line DLb in the non-display area NDA, and the second barrier layer BR2 may be provided between the third insulating layer INS3 and the source electrode SE, between the third insulating layer INS3 and the drain electrode DE, and between the third insulating layer INS3 and the data line DL (refer to FIGS. 4B, 5A and 5B) in the display area DA.

Referring to FIG. 9, in the illustrated exemplary embodiment, a line may be disposed in a layer different from that of the above-described exemplary embodiment. In this case, the line may also be provided in the line structure according to the exemplary embodiment of the invention.

In the illustrated exemplary embodiment, the second data line DLb may be provided on the fourth insulating layer INS4 instead of the third insulating layer INS3 in the bent area BA. In this case, the second data line DLb may be connected to the first data line DLa and the third data line DLc through a bridge BG disposed on the third insulating layer INS3.

In the illustrated exemplary embodiment, the bent part insulating layer INS_B, the third insulating layer INS3, and the fourth insulating layer INS4 may be provided as organic insulating layers, and a line disposed on the bent part insulating layer INS_B, the third insulating layer INS3, and the fourth insulating layer INS4 may be provided in the line structure according to the exemplary embodiment of the invention. In an exemplary embodiment, each of the source electrode SE, the drain electrode DE, the data line, and the connection line CNP may be provided to include first to third metal layers, for example. In this case, a third barrier layer BR3 may be provided between the fourth insulating layer INS4 and the second data line DLb in the non-display area NDA. The second barrier layer BR2 may be provided between the third insulating layer INS3 and the source electrode SE, between the third insulating layer INS3 and the drain electrode DE, and between the third insulating layer INS3 and the data line DL (refer to FIGS. 4B, 5A and 5B) in the display area DA, and the third barrier layer BR3 may be provided between the fourth insulating layer INS4 and the connection line CNP.

As described above, each of the insulating layers constituting the display device may be provided as an organic insulating layer or an inorganic insulating layer. When the insulating layer is provided as an organic insulating layer, a barrier layer may be interposed between the organic insulating layer and a line.

In an exemplary embodiment of the invention, the first insulating layer and the passivation layer may be inorganic insulating layers. Although a case where the first insulating layer and the passivation layer are organic insulating layers is not described, the invention is not limited thereto. The first insulating layer and the passivation layer may also be organic insulating layers, when necessary. In this case, the line structure according to the exemplary embodiment of the invention may be employed in the gate electrode and the scan lines. In addition, it will be apparent that the line structure according to the exemplary embodiment of the invention may be employed in lines disposed on the fifth insulating layer or the pixel defining layer.

The display device according to the invention may be employed in various electronic devices. In an exemplary embodiment, the display device may be applied to televisions, notebook computers, cellular phones, smart phones, smart pads, PMPs, PDAs, navigations, various wearable devices such as smart watches, for example.

In the line structure according to the exemplary embodiment of the invention, the corrosion of a line is prevented as compared with the typical line structures, so that the occurrence of a defect in the line is minimized. Further, in the line structure according to the exemplary embodiment of the invention, patterning is easily performed as compared with the typical line structures, so that the display device may be easily manufactured.

According to the invention, the display device employs the above-described line structure, so that the occurrence of a defect may be minimized.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular exemplary embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. A display device comprising:
    a substrate including a display area and a non-display area;
    a plurality of pixels provided in the display area;
    lines respectively connected to the plurality of pixels, the lines applying a signal to the plurality of pixels, the lines each including a first metal layer including a first metal and a second metal layer which is directly provided on the first metal layer and includes a second metal;
an insulating layer provided at a least one portion between the substrate and the lines, the insulating layer including an inorganic insulating layer and an organic insulating layer; and
a barrier layer provided between the organic insulating layer and the first metal layer, the barrier layer including an oxide of the first metal.

2. The display device of claim 1, wherein the organic insulating layer, the barrier layer, and the lines include oxygen atoms having a highest concentration peak in the barrier layer.

3. The display device of claim 2, wherein the first metal and the oxygen atoms are contained at a ratio of about 1:1 to about 3:1 in the barrier layer.

4. The display device of claim 1, wherein the barrier layer has a thickness of about 10 angstroms to about 200 angstroms.

5. The display device of claim 4, wherein the first metal layer has a thickness of about 250 angstroms to about 600 angstroms.

6. The display device of claim 1, wherein the organic insulating layer includes at least one of a polyimide-based compound, a polyacryl-based compound, a fluorine-based polymer compound including Teflon, a polyorganosiloxane-based compound, a benzocyclobutene-based compound, a phenol-based compound, an epoxy-based compound, polyamide-based compound, polyphenylene ether-based compound, and a polyphenylene sulfide-based compound.

7. The display device of claim 1, wherein the first metal is titanium and the second metal is aluminum.

8. The display device of claim 7, further comprising a third metal layer provided on the second metal and including a third metal.

9. The display device of claim 8, wherein the third metal is titanium.

10. The display device of claim 1, wherein the insulating layer is provided in plurality, at least one of the plurality of insulating layers is provided as the organic insulating layer, the lines are provided on at least one of the plurality of insulating layers, and the barrier layer is provided between the organic insulating layer and the lines.

11. The display device of claim 10, wherein the lines include a first line provided on one of the plurality of insulating layers and a second line provided on one of the others of the plurality of insulating layers, and the first line and the second line are connected to each other through a contact hole defined in an insulating layer of the plurality of insulating layers provided between the first line and the second line.

12. The display device of claim 11, wherein the contact hole is defined as a sidewall provided by removing the insulating layer provided between the first line and the second line, and the barrier layer is provided on the sidewall when the insulating layer provided between the first line and the second line is the organic insulating layer.

13. The display device of claim 12, wherein the first line and the second line are in direct contact with each other in the contact hole, and the barrier layer is not provided between the first line and the second line.

14. The display device of claim 10, wherein the plurality of insulating layers includes first to fourth insulating layers sequentially provided on the substrate.

15. The display device of claim 14, wherein the non-display area includes a bent area in which the substrate is bent,
wherein an opening through which a portion of the substrate is exposed is defined in the first to third insulating layers in the bent area, and the insulating layer includes a bent part insulating layer provided as the organic insulating layer in the opening.

16. The display device of claim 14, wherein each of the plurality of pixels includes:
a thin film transistor provided on the substrate; and
a display element connected to the thin film transistor,
wherein the thin film transistor includes:
an active pattern provided on the substrate;
a gate electrode provided on the first insulating layer; and
source and drain electrodes provided on the third insulating layer.

17. The display device of claim 16, wherein the lines include data lines connected to the source electrodes.

18. The display device of claim 17, wherein the data lines are provided on the third insulating layer, the third insulating layer is provided as the organic insulating layer, and the barrier layer is provided between the data lines and the third insulating layer.

19. The display device of claim 18, wherein the lines further include connection lines which are connected to the data lines and are provided on the fourth insulating layer, the fourth insulating layer is provided as the organic insulating layer, and the barrier layer is provided between the connection lines and the fourth insulating layer.

20. The display device of claim 1, wherein the non-display area includes a bent area in which the substrate is bent,
wherein the insulating layer includes a bent part insulating layer provided as the organic insulating layer in the bent area.

21. The display device of claim 20, wherein the lines are provided on the bent part insulating layer in the bent area, and the barrier layer is provided between the lines and the bent part insulating layer.

22. The display device of claim 1, wherein the non-display area includes a bent area in which the substrate is bent,
wherein the insulating layer is provided in plurality, and the plurality of insulating layers includes first to fourth insulating layers,
wherein the insulating layer includes a bent part insulating layer provided in the bent area and a fourth insulating layer provided on the bent part insulating layer, and
wherein the bent part insulating layer and the fourth insulating layer are provided as the organic insulating layers, the lines are provided on at least one of the bent part insulating layer and the fourth insulating layer, and the barrier layer is provided between the lines and at least one of the bent part insulating layer and the fourth insulating layer.

23. The display device of claim 1, wherein the organic insulating layer and the barrier layer are in contact with each other, and the barrier layer and the first metal layer are in contact with each other.

24. A line structure comprising:
a substrate;
a line provided on the substrate;
an organic insulating layer provided in at least one region between the substrate and the line; and
a barrier layer provided between the organic insulating layer and the line, wherein the line includes a first metal layer including a first metal and a second metal layer which is directly provided on the first metal layer and includes a second metal, and the barrier layer includes an oxide of the first metal.

25. A method for forming a line, the method comprising:
forming an organic insulating layer in at least one region on a substrate;
forming a barrier layer on the substrate on which the organic insulating layer is provided; and
forming a line on the barrier layer,
wherein the forming the line includes:
forming a first metal layer on the barrier layer;
forming a second metal layer on the first metal layer; and
patterning the first and second metal layers,
wherein the barrier layer and the first metal layer are provided through a single process.

26. The method of claim 25, wherein the barrier layer and the first metal layer are provided through one of chemical vapor deposition, physical vapor deposition, atomic layer deposition, and spacer patterning.

* * * * *